United States Patent
Pappu et al.

(10) Patent No.: US 10,303,237 B2
(45) Date of Patent: May 28, 2019

(54) PHASE LOCK LOOP BYPASS FOR BOARD-LEVEL TESTING OF SYSTEMS

(71) Applicant: Intel Corporation, Santa Clara, CA (US)

(72) Inventors: Lakshminarayana Pappu, Folsom, CA (US); Baruch Schnarch, Zichron-Ya'akov (IL)

(73) Assignee: Intel Corporation, Santa Clara, CA (US)

( * ) Notice: Subject to any disclaimer, the term of this patent is extended or adjusted under 35 U.S.C. 154(b) by 118 days.

(21) Appl. No.: 15/468,527

(22) Filed: Mar. 24, 2017

(65) Prior Publication Data

US 2018/0275736 A1    Sep. 27, 2018

(51) Int. Cl.
| | |
|---|---|
| *G06F 1/00* | (2006.01) |
| *G06F 1/3203* | (2019.01) |
| *H03L 7/099* | (2006.01) |
| *G06F 13/42* | (2006.01) |

(52) U.S. Cl.
CPC ............ *G06F 1/3203* (2013.01); *G06F 13/42* (2013.01); *H03L 7/0995* (2013.01); *G06F 2213/0012* (2013.01)

(58) Field of Classification Search
None
See application file for complete search history.

(56) References Cited

U.S. PATENT DOCUMENTS

| | | | |
|---|---|---|---|
| 6,661,254 B1* | 12/2003 | Agrawal | H03K 19/17736 326/38 |
| 6,704,892 B1* | 3/2004 | Kurd | G01R 31/31725 327/163 |
| 2005/0229066 A1* | 10/2005 | Wolff | G01R 31/31716 714/744 |
| 2012/0162835 A1* | 6/2012 | Xiao | H02H 9/046 361/56 |

* cited by examiner

*Primary Examiner* — Nitin C Patel
(74) *Attorney, Agent, or Firm* — Schwabe, Williamson & Wyatt, P.C.

(57) ABSTRACT

Embodiments are generally directed to phase lock loop bypass for board level testing of systems. An embodiment of system includes a power management block for the system; multiple IO (input/output) blocks; a phase lock loop (PLL) block for each of the IO blocks, each of the phase lock loop blocks being switchable between providing an output of a PLL clock signal or providing a replacement clock signal as clocking for the respective IO block; and a read only memory for storage of firmware. In some embodiments, the firmware includes elements to enable operation of the plurality of IO blocks utilizing replacement clocking.

22 Claims, 6 Drawing Sheets

PHASE LOCK LOOP BYPASS FOR BOARD-LEVEL TESTING OF SYSTEMS

TECHNICAL FIELD

Embodiments described herein generally relate to the field of electronic devices and, more particularly, a PLL (Phase Lock Loop) bypass for board-level testing of systems.

BACKGROUND

With the growing complexity of integrated systems such as SoCs (Systems on Package), the power management of the varied elements of such systems has become a crucial element of the system operation. In the power management of systems, one of the functions of the firmware and BIOS (Basic Input/Output System) generally is to shut down as many components of the system as possible to reduce power consumption, including shutdown in a reset sequence.

However, this shutdown operation during the reset sequence runs contrary to platform testing (also referred to as board-level testing) requirements, which require having as many components as possible to be enabled for accurate testing.

Among the elements that are shut down by power management are the clock elements for the system. When a platform test is enabled, the clocks supplied by the platform controller hub (PCH) thus have been disabled by the PCH platform testing chain. However, the shutdown of the clocking prevents implementation of reliable board level testing.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
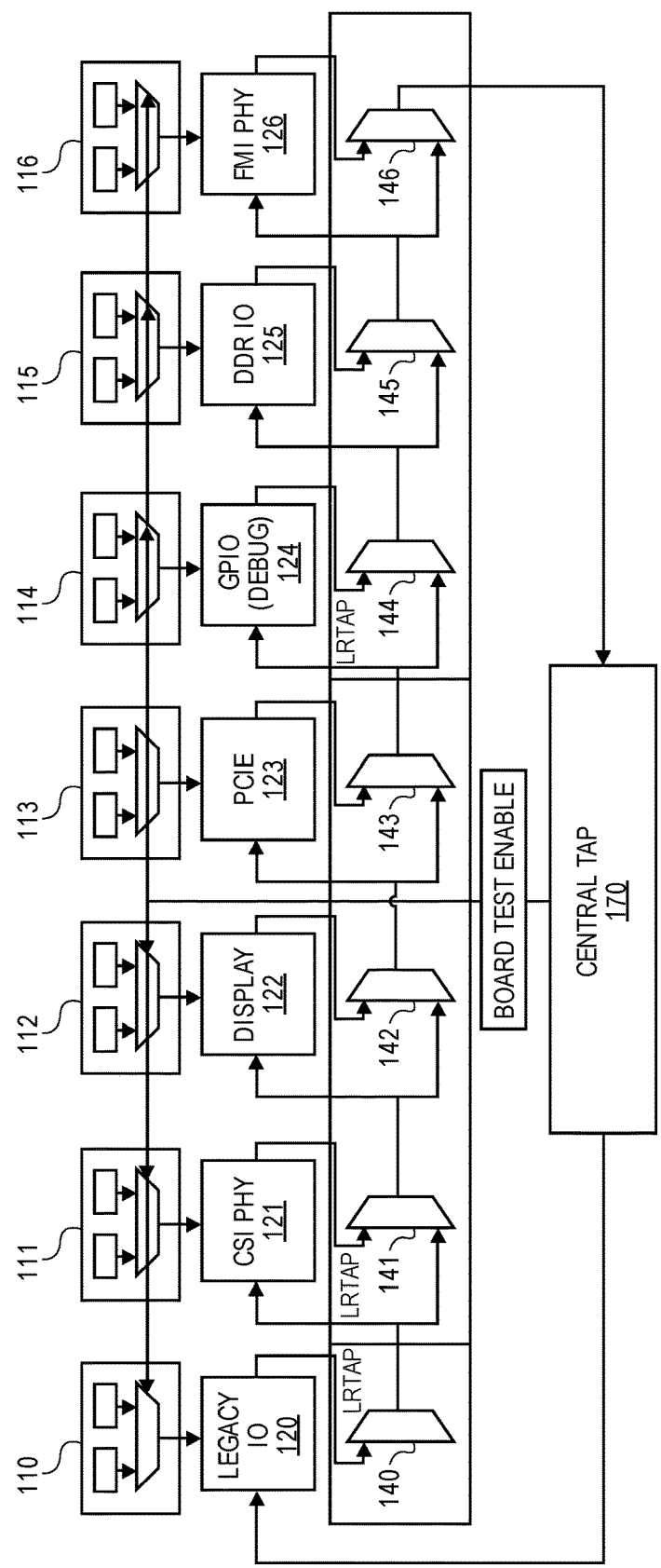
FIG. 1 illustrates an apparatus providing replacement clocking for IO blocks in a board-level test mode according to an embodiment.

Embodiments described herein are generally directed to phase lock loop bypass for board-level testing for system on chips.

For the purposes of this description:

"Phase lock loop", "phased-lock loop"," or "PLL" refers to a control system that generates an output signal having a phase that is related to the phase of an input signal, with PLL circuits being commonly used in computer clock generation.

In some embodiments, an apparatus, system, or process provides for enabling clocking of IO (Input Output)) elements for testing purposes in a reset sequence in which the standard phase lock loop clocking is disabled, the clocking of the IO elements being provided instead through use of a replacement clock signal. In some embodiments, the replacement clock signal is generated by a ring oscillator. In some embodiments, a reset sequence for an electronic system operates to disable the phase lock loops utilized to generate clocking, and replacement clock elements for each element are instead utilized to produce clock signals for the IO elements under test.

Board-level testing in general may be required to be compliant with two IEEE standards:

(a) IEEE 1149.1-2001[2013] "IEEE Standard for Test Access Port and Boundary-Scan Architecture"; and (b) IEEE 1149.6-2003 [2015] "IEEE Boundary-Scan Testing of Advanced Digital Networks".

The IEEE 1149.1-2001 standard defines test access port and boundary-scan architecture for digital integrated circuits and for the digital portions of mixed analog/digital integrated circuits. The facilities defined by the standard seek to provide a solution to the problem of testing assembled printed circuit boards and other products based on highly complex digital integrated circuits and high-density surface mounting assembly techniques. The facilities also provide a means of accessing and controlling design-for-test features built into the digital integrated circuits themselves. Such features might, for example, include internal scan paths and self-test functions as well as other features intended to support service applications in the assembled product.

IEEE 1149.6-2003 standards defines extensions to IEEE Std. 1149.1 to standardize the Boundary-Scan structures and methods required to ensure simple, robust, and minimally intrusive Boundary-Scan testing of advanced digital networks. However, such networks are not adequately addressed by existing standards, especially for those networks that are AC-coupled, differential, or both. Testing enabled by this standard operate in parallel with IEEE Std. 1149.1 testing of conventional digital networks. The boundary-scan technique involves the inclusion of a shift-register stage (contained in a boundary scan register cell) adjacent to each component pin so that signals at component boundaries can be controlled and observed using scan testing principles.

However, when a board level test is enabled the clocks supplied by the PCH (Platform Controller Hub) will be disabled. The respective clock pins are on the PCH scan chain and, when the customer or other tester enables board-level testing, these clocks are disabled. In addition, power management is becoming increasingly complex, and IO blocks may be turned-off by default for low power consumption.

Board-level testing requires IO blocks to be "functional" to transmit signals into and out of the chip. The IO blocks and the control signals the IP controllers are expecting should be alive and propagate to their destinations. Several power management signals from the PMC/PCU (power management blocks) should continue to be transmitted to these IP blocks despite clocks being shut off. In a board-level testing mode, if certain signals need to be overridden, the IO needs to receive clock toggling. Without such operation, there are X values (unknown states that are neither logical '1' nor '0' values), the X values causing testing to be unpredictable.

In some embodiments, an apparatus, system, or process provides replacement clocking to allow clock toggling in lieu of PLL clocking when the PLL clocking is shut down.

In some embodiments, clocking for one or more IO blocks is switched from clocking from a PLL block, including PLL circuitry, to clocking from a replacement clock element for a board-level test operation. In some embodiments, the replacement clock signal is a locally generated clock signal. In some embodiments, the replacement clock signal is a signal that is always running when a system is powered. In some embodiments, the replacement clock signal is a reduced frequency clock signal in comparison with the PLL clock for normal operation.

In some embodiments, replacement clocking is supplied to IO blocks by ring oscillator elements of the PLL components. In general a ring oscillator is a device including, for example, an odd number of NOT logical gates in a ring, thus producing an output that oscillates between voltages levels for logical '1' and logical '0'. The ring oscillator is a locally generated, always running clock, and thus the ring oscillator may be made available to IO blocks to provide replacement clocking in an embodiment. A ring oscillator clock signal is generally a reduced frequency in comparison with a PLL clock signal.

Functionally, ring oscillators exist in each PLL, these clock elements being utilized to eliminate unknown states and prevent the current droops in the system during the time period from when the system powers up to the time the PLL element locks and the PLL clock signal is are available. In some embodiments, a board-level testing setup instruction selects the ring oscillator clock, and hence the sequential logic on several design control signals continues to see the clock during the board-level testing mode. In some embodiments, because a modified form of the functional mode of operation is provided by the replacement clocking, there is no additional penalty either in the front-end or in the back-end of system for incorporating the platform board testing design requirements.

In some embodiments, hooks are added to the firmware for the system, wherein adding hooks refers to creating an alternative execution branch for the power-management firmware for use in board-level testing of the system. As used herein, IO blocks refer to IO blocks, circuits, components, or other structures, and PLL blocks refer to PLL blocks, circuits, components, or other structures. In some embodiments, the firmware hooks are provided to enable clocking by the replacement clock elements, such as the ring-oscillator clocks, to replace the PLL clocking and thereby eliminate unknown states for the board-level testing operation. In some embodiments, the firmware is to maintain enablement of all the IO blocks during the board-level testing mode, i.e., does not power gate these blocks.

FIG. 1 illustrates an apparatus providing replacement clocking for IO blocks in a board-level testing mode according to an embodiment. In some embodiments, to enable board testing operation for each of multiple IO blocks of an apparatus, wherein the normal PLL clocking for the IO blocks is disabled, clocking for each of the IO blocks is switched to a replacement clock signal to allow the testing operation.

As illustrated in FIG. 1, IO blocks in an apparatus may include, but are not limited to, legacy IO block 120, CSI (Camera Serial Interface) Phy IO block 121, Display IO block 122, PCIE (Peripheral Component Interconnect express) IO block 123, GIPO (General Purpose Input Output, utilized for debug) IO block 124, DDR (Double Data Rate) IO block 125, and FMI (Far Memory Interface) Phy 126. However, these IO blocks are examples, and an apparatus may include different or additional IO blocks.

In some embodiments, each of the illustrated IO blocks receives clocking via a respective PLL block, such as the illustrated PLL blocks 110 to 116 each supplying clocking to a respective IO block of IO blocks 120 to 126, the PLL blocks including PLL circuitry. In some embodiments, each PLL block 110 to 116 includes a PLL portion to provide PLL clocking in an operational mode and a replacement clock portion to provide replacement clocking in a board-level testing mode. In some embodiments, each of the PLL blocks is to switch between the respective PLL portion or replacement clock portion in response to a board-level test enable signal received from a central TAP (Test Access Port) 170, with the replacement clock portions being enabled upon the board test being initiated and the PLL block portions being enabled upon the board-level test being completed.

In some embodiments, each of the IO blocks is coupled with a bypass component, such as each of IO blocks 120 to 126 being coupled with a respective bypass multiplexer 140 to 146 upon receipt of a signal provided via the central TAP 170. In some embodiments, the bypass components may be utilized to select testing of a particular IO block while bypassing other IO blocks.

Figure 2:
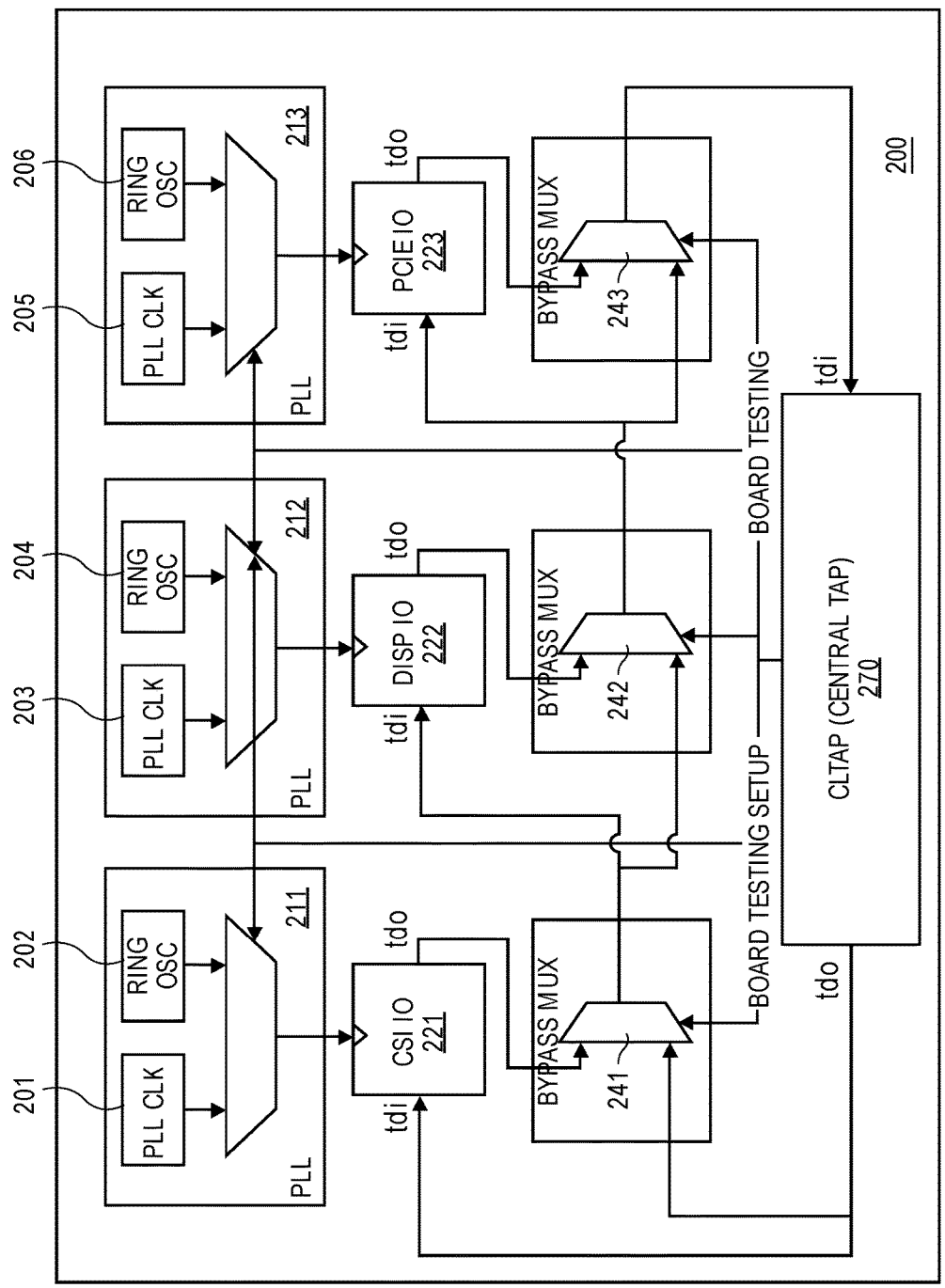
FIG. 2 illustrates an apparatus providing ring oscillator clocking for a board-level test mode according to an embodiment.

It is noted that the structures illustrated in FIGS. 1 and 2 are examples, and embodiments are not limited to the particular circuit structure provided in such figures. It is further noted that the PLL blocks do not necessarily represent separate PLLs for each IO block, but rather in some embodiments merely are supplying clocks to the IO blocks.

FIG. 2 illustrates an apparatus providing ring oscillator clocking for a board-level testing mode according to an embodiment. As illustrated in FIG. 2, IO blocks in an apparatus 200 may include, but are not limited to, a CSI IO block 221, a Display IO block 222, and a PCIE IO block 223. In some embodiments, the illustrated IO blocks receive clocking via PLL blocks, such as a first PLL block 211 supplying a clock signal to CSI IO block 221, a second PLL block 212 supplying a clock signal to Display IO block 222, and a third PLL block 213 supplying a clock signal to PCIE IO block 223.

In some embodiments, each PLL block 221-223 is operable to select (such as by using the illustrated multiplexer of each PLL block) either a PLL portion to provide a PLL clock signal or a ring oscillator portion to provide a replacement clock signal to the respective IO block, illustrated as PLL clock 201 or ring oscillator clock 202 to the CSI IO block 221, PLL clock 203 or ring oscillator clock 204 to the Display IO block 222, and PLL clock 205 or ring oscillator clock 206 to the PCIE IO block 223. In some embodiments, the apparatus 200 further includes a bypass component for each IO block, illustrated as bypass multiplexer 241 for the CSI IO block 221, bypass multiplexer 242 for the Display IO block 222, and bypass multiplexer 243 for the PCIE IO block 223, to bypass the output of each such IO block.

Further illustrated in FIG. 2 is the central TAP (CLTAP) 270, which is some embodiments may be utilized to provide test signals received from an external testing unit or other element. In some embodiments, the central TAP 270 is operable to provide board testing setup and board testing signals to switch the PLL blocks 211, 212, and 213, and the bypass multiplexers 241, 242, and 243 for either normal mode operation or testing mode operation. In some embodiments, upon receiving a test signal from the central TAP 270 indicating activation of the board-level testing mode, the PLL blocks 211, 212, and 213 are operable to send the IO blocks the ring oscillator clock signals instead of the PLL clock signals, wherein the PLL clock signals are disabled and thus not available for use in the board-level testing mode.

In some embodiments, the bypass path provided by the bypass multiplexers 241, 242, and 243 further provides the capability to bypass any particular IO block in the testing process. As illustrated in FIG. 2, the central TAP 270 is to provide test data out (tdo) that is received by an IO block as test data in (tdi), where the test data may be directed to any of the IO blocks via the appropriate setting of the bypass multiplexers 241 to 243. Each bypass multiplexer includes a first input from the respective IO block for the bypass multiplexer and a second input from a preceding bypass multiplexer, or, for a first bypass multiplexer 241, a second input being the test data from central TAP 270. Further, the output of each bypass multiplexer provides a test data input to a following IO block and to the bypass multiplexer of the following IO block, or, for a last bypass multiplexer 243, providing a tdi input to the central TAP 270.

Figure 3:
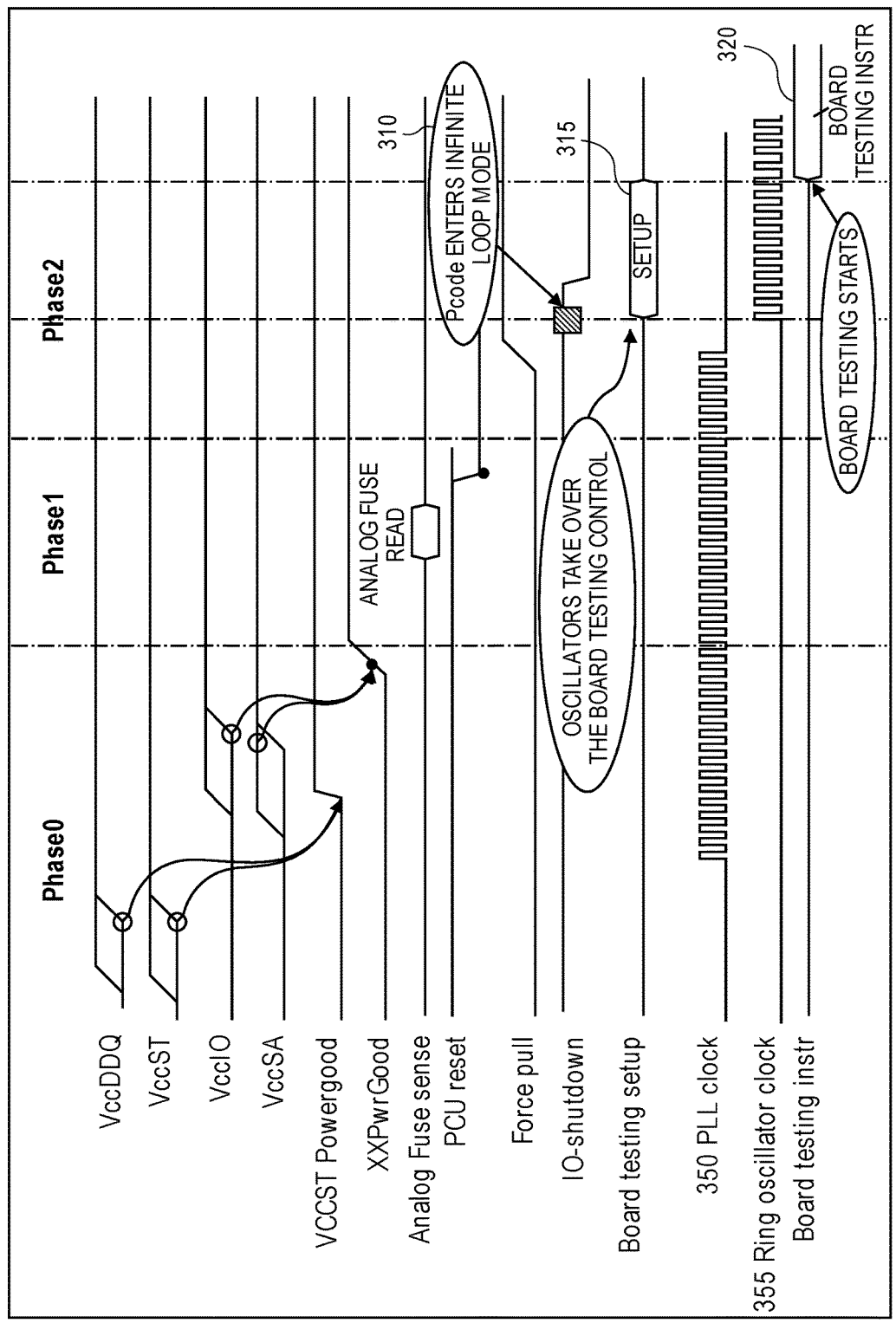
FIG. 3 is a timing diagram to illustrate operations in a reset sequence to support board-level testing of a system including bypassing of PLL clocking according to an embodiment.

FIG. 3 is a timing diagram to illustrate operations in a reset sequence to support board-level testing of a system including bypassing of PLL clocking according to an embodiment. FIG. 3 illustrates bringing up the various power rails (VccDQ, VccST, VccIO, VccSA) of the system in a Phase-0 period, and the resulting Power-Good signals for the Phase-1 period. In Phase-1 there is illustrated the analog fuse read and the PCU reset.

As further illustrated in Phase-0 and Phase-1, the clocking of a PLL clock 350 of one or more phase clocks is enabled for clocking of one or more IO blocks. In some embodiments, in the following Phase-2 period, upon the implementation of the board level testing mode, the PLL clock 350 is disabled and clocking is switched to ring oscillator 355 or other replacement clock element. In some embodiments, testing operation for one or more IO blocks is implemented utilizing the clocking of the ring oscillator as the clocking for the one or more IO blocks.

It is noted that FIG. 3 further includes the management of IO block operation for the testing process, illustrating in Phase-2 Pcode/firmware entering an infinite loop mode 310 and the board testing setup 315 to enable the board-level testing instruction 320, including the testing of the IO blocks without loss of power to such blocks. This concept may be implemented as provided in U.S. patent application Ser. No. 15/468,523, entitled "Managing IO Block Operation in Electronic Systems for Board Testing". However, embodiments under the present application are not limited to the implementation of IO block management provided in such application.

Figure 4:
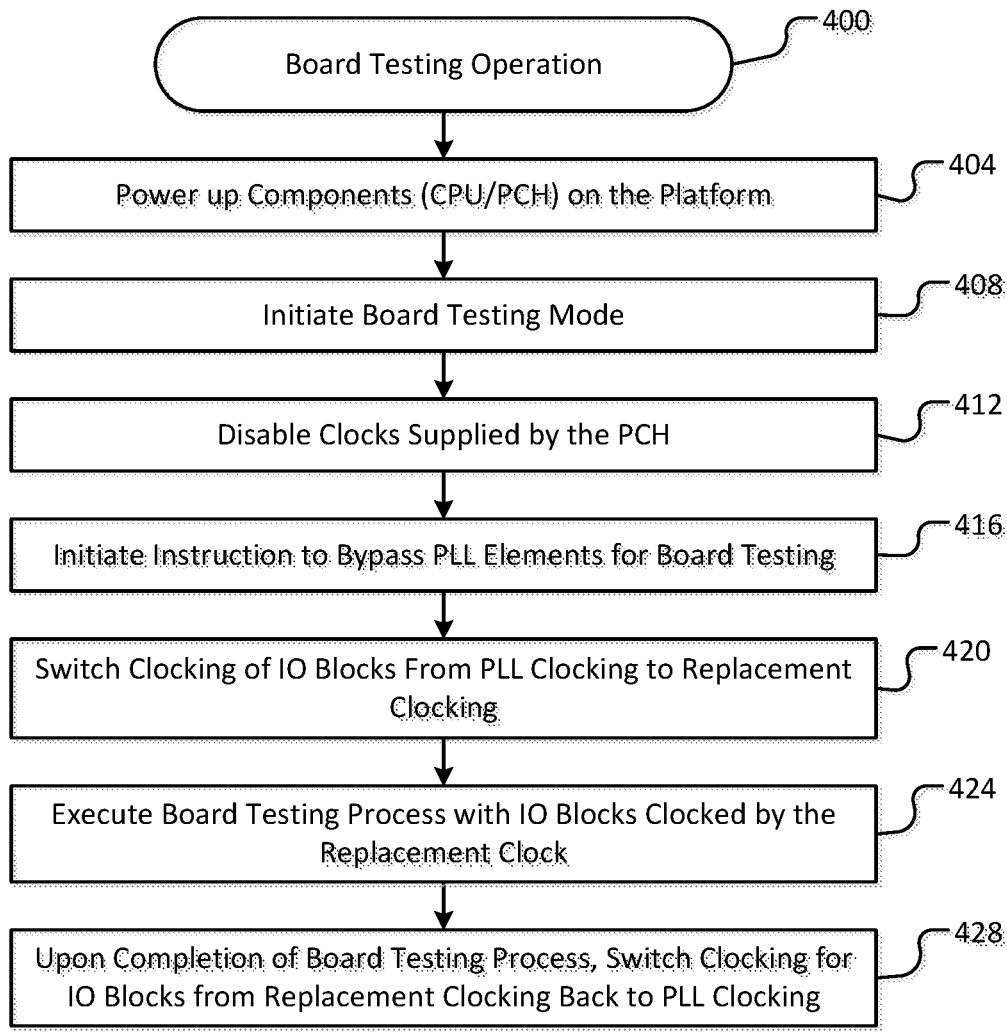
FIG. 4 is a flowchart to illustrate a testing process including bypassing of PLL clocking according to an embodiment.

FIG. 4 is a flowchart to illustrate a testing process including bypassing of PLL clocking according to an embodiment. In some embodiments, a sequence for board testing operations 400 includes the following:

404: Powering up components (CPU (Central Processing Unit)/PCH (Platform Controller Hub)) on the platform.

408: After a certain time delay, the time delay to provide a sufficient amount of time (such as a few milliseconds) for the relevant power up sequence, initiate board testing mode.

412: Clocks supplied by the PCH are disabled in response to board testing.

416: Initiate an instruction to bypass PLL elements for board testing.

420: Switch clocking of IO blocks from PLL clocking to replacement clocking. In some embodiments, the replacement clocking is ring oscillator clocking.

424: Execute the board testing process with IO blocks being clocked by replacement clocking.

428: Upon completion of board testing process, switch clocking for IO blocks from replacement clocking back to PLL clocking.

Figure 5:
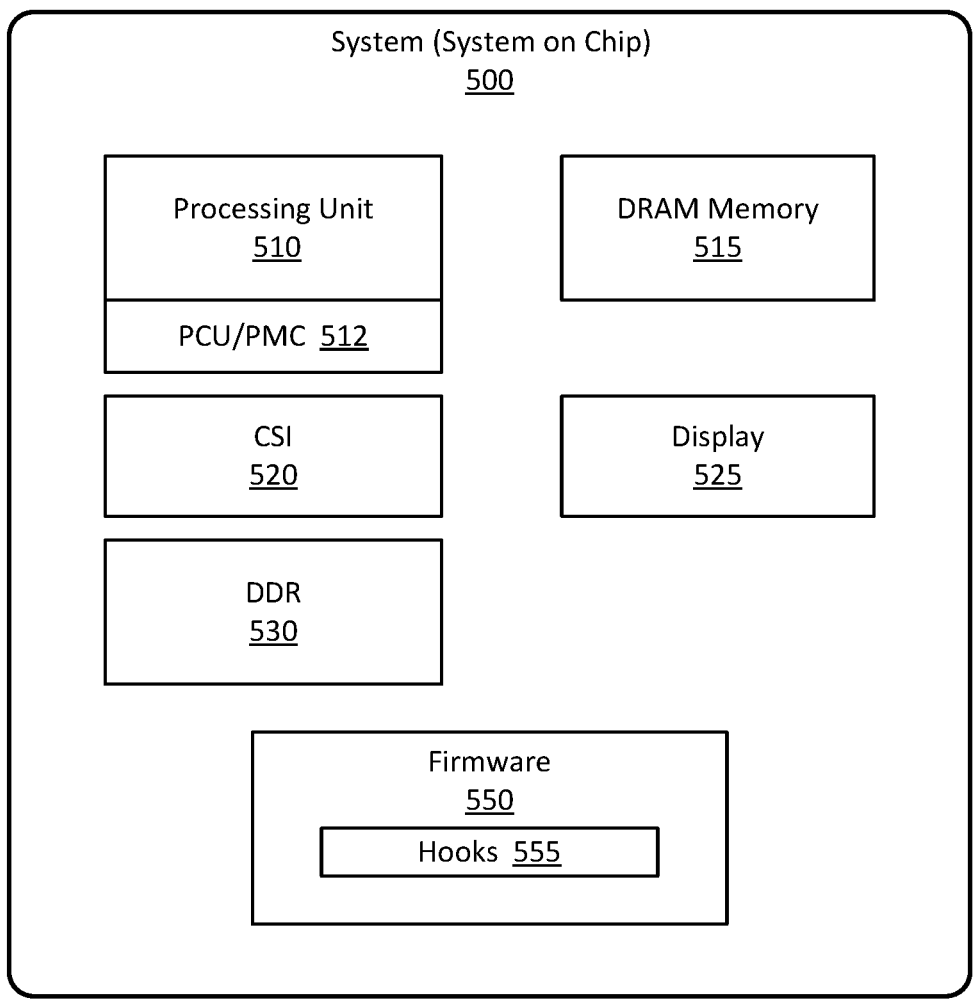
FIG. 5 is an illustration of a system for board-level testing according to an embodiment.

FIG. 5 is an illustration of a system for board-level testing according to an embodiment. As illustrated the system 500, such as a system on chip (SoC), includes a processor 510, wherein the processor may include power control elements such as the illustrated PCU/PMC (platform controller unit/power management controller) 512. The system 500 further includes elements memory such as the illustrated DRAM (dynamic random access memory) 515, and various IO blocks, such as the illustrated CSI 520, display 525, and DDR (double data rate) 530 IO blocks. Also illustrated is the firmware 550, which is generally stored in read-only memory ROM.

In a reset operation, a conventional system will shut down PLL clocking for the IO blocks, which will result in interfering with a board-level test of the system that requires that each IO block be clocked for accurate testing. In some embodiments, the system 500 will utilize added firmware hooks 555 to enable replacement clocking of components for board testing, wherein the replacement clocking may include ring oscillator clocking.

Figure 6:
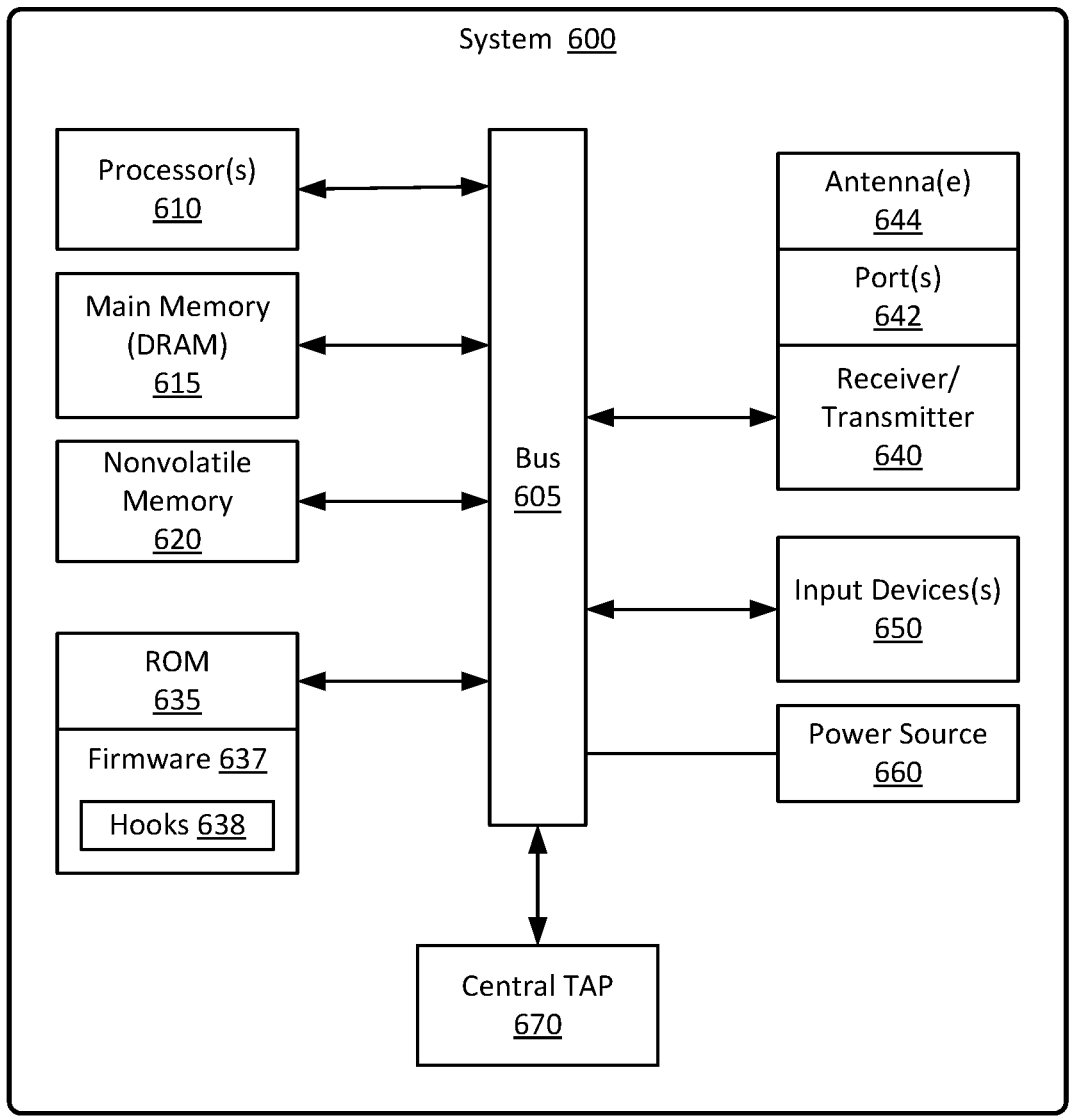
FIG. 6 is an illustration of a system to provide for maintenance of IO block operation for board-level testing according to an embodiment.

FIG. 6 is an illustration of a system to provide for maintenance of IO block operation for board-level testing according to an embodiment. In this illustration, certain standard and well-known components that are not germane to the present description are not shown. The system 600 may include an SoC (System on Chip) combining multiple elements on a single chip.

In some embodiments, the system 600, such as a computing system, may include a processing means such as one or more processors 610 coupled to one or more buses or interconnects, shown in general as bus 605. The processors 610 may comprise one or more physical processors and one or more logical processors. In some embodiments, the processors may include one or more general-purpose processors or special-purpose processors.

The bus 605 is a communication means for transmission of data. The bus 605 is illustrated as a single bus for simplicity, but may represent multiple different interconnects or buses and the component connections to such interconnects or buses may vary. The bus 605 shown in FIG. 6 is an abstraction that represents any one or more separate physical buses, point-to-point connections, or both connected by appropriate bridges, adapters, or controllers.

In some embodiments, the system 600 further comprises a random access memory (RAM) or other dynamic storage device or element as a main memory 615 for storing information and instructions to be executed by the processors 610. Main memory 615 may include, but is not limited to, dynamic random access memory (DRAM).

The system 600 also may comprise a non-volatile memory 620; and a read only memory (ROM) 635 or other static storage device for storing static information and instructions for the processors 610. In some embodiments, the ROM includes firmware 637 including hooks 638 to provide support for board-level testing of the system 600, including support for replacement clocking for IO blocks during a board level test in which PLL clocking is disabled. In some embodiments, the system 600 includes one or more input devices 650, which may include devices to input certain test commands or data.

In some embodiments, the system 600 further includes a central TAP (Test Access Port) 670, the central TAP 670 providing support for board level testing of the system. In some embodiments, the central TAP 670 includes operations to enable replacement clocking for a board testing operation such as illustrated for central TAP 170 illustrated in FIG. 1 and central TAP 270 illustrated in FIG. 2.

In some embodiments, the system 600 includes one or more transmitters or receivers 640 coupled to the bus 605. In some embodiments, the system 600 may include one or more antennae 644, such as dipole or monopole antennae, for the transmission and reception of data via wireless communication using a wireless transmitter, receiver, or both, and one or more ports 642 for the transmission and reception of data via wired communications. Wireless communication includes, but is not limited to, Wi-Fi, Bluetooth™, near field communication, and other wireless communication standards.

The system 600 may also comprise a battery or other power source 660, which may include a solar cell, a fuel cell, a charged capacitor, near field inductive coupling, or other system or device for providing or generating power in the system 600. The power provided by the power source 660 may be distributed as required to elements of the system 600.

In some embodiments, a system includes a power management block for the system; a plurality of IO (input/output) blocks; a phase lock loop (PLL) block for each of the plurality of IO blocks, each of the phase lock loop blocks being switchable between providing an output of a PLL clock signal or a replacement clock signal; and a read only memory for storage of firmware. In some embodiments, the firmware includes elements to enable operation of the plurality of IO blocks utilizing replacement clocking.

In some embodiments, the replacement clock signal for each IO block is provided by a ring oscillator of the PLL block.

In some embodiments, a replacement clock signal has a reduced frequency in comparison with a frequency of a respective PLL clock signal.

In some embodiments, the system further includes a central TAP (Test Access Port), the central TAP to provide a signal to each PLL block to switch between the PLL clock signal and the replacement clock signal.

In some embodiments, the system further includes a bypass component for each of the plurality of IO blocks, the bypass components being controllable by signals from the central TAP to select IO blocks for testing.

In some embodiments, the bypass component for each of the plurality of IO blocks is a bypass multiplexer, and wherein a first input of the bypass multiplexer of each IO block is coupled with an output of the respective IO block.

In some embodiments, a second input of the bypass multiplexer for each of the IO blocks is coupled with an output of a preceding bypass multiplexer or, for a first bypass multiplexer, with an output of the central TAP.

In some embodiments, an output of the bypass multiplexer for each of the IO blocks is coupled with the second input of a succeeding bypass multiplexer or, for a last bypass multiplexer, with an input of the central TAP.

In some embodiments, the system further includes a processing unit, the firmware to be executed by the processing unit.

In some embodiments, the system is a system on chip.

In some embodiments, a non-transitory computer-readable storage medium having stored thereon data representing sequences of instructions that, when executed by a processor, cause the processor to perform operations powering up components of a system; initiating a board test of the system, the board test including testing of a plurality of IO blocks; disabling phase lock loop (PLL) clocking for the plurality of IO blocks; providing instruction to bypass PLL elements for board testing; switching clocking of IO blocks to replacement clocking; and executing board testing process with IO blocks clocked by replacement clocking.

In some embodiments, the medium further includes instructions for, upon completion of the board testing process, switching clocking for the plurality of IO blocks back to PLL clocking.

In some embodiments, the replacement clocking for each IO block is provided by a respective ring oscillator.

In some embodiments, a replacement clock signal has a reduced frequency in comparison with a frequency of a respective PLL clock signal.

In some embodiments, the system includes a bypass component for each of the IO blocks, and further comprising instructions for setting one or more bypass components to select one or more IO blocks for testing.

In some embodiments, the bypass components for the IO blocks are bypass multiplexers.

In some embodiments, an apparatus includes means for powering up components of the apparatus; means for initiating a board test of the apparatus, the board test including testing of a plurality of IO blocks; means for disabling phase lock loop (PLL) clocking for the plurality of IO blocks; means for providing instruction to bypass PLL elements for board testing; means for switching clocking of IO blocks to replacement clocking; and means for executing board testing process with IO blocks clocked by replacement clocking.

In some embodiments, the apparatus further includes means for switching clocking for the plurality of IO blocks back to PLL clocking.

In some embodiments, the replacement clocking for each IO block is provided by a respective ring oscillator.

In some embodiments, a replacement clock signal has a reduced frequency in comparison with a frequency of a respective PLL clock signal.

In some embodiments, the apparatus further includes means for bypassing each of the IO blocks, wherein the means for bypassing each of the IO blocks includes means for selecting one or more IO blocks for testing.

In some embodiments, the means for bypassing each of the IO blocks includes bypass multiplexers.

In some embodiments, a computing system includes one or more processors; a power management block for the system; a plurality of IO (input/output) blocks; a phase lock loop (PLL) block for each of the plurality of IO blocks, each of the PLL blocks being switchable between providing an output of a PLL clock signal or a replacement clock signal; a read only memory for storage of firmware to be executed by the one or more processors; and a transmitter or receiver for transmission or reception of data, and a dipole antenna for the transmission or reception of data. In some embodiments, the firmware includes elements to enable operation of the plurality of IO blocks utilizing replacement clocking.

In some embodiments, the replacement clock signal for each IO block is provided by a ring oscillator of the PLL block.

In some embodiments, a replacement clock signal has a reduced frequency in comparison with a frequency of a respective PLL clock signal.

In some embodiments, the computing system further includes a central TAP (Test Access Port), the central TAP to provide a signal to each PLL block to switch between the PLL clock signal and the replacement clock signal.

In some embodiments, the computing system further includes a bypass component for each of the IO blocks, the bypass elements being controllable by signals from the central TAP to select IO block elements for testing.

In some embodiments, the bypass component for each of the plurality of IO blocks is a bypass multiplexer.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

What is claimed is:

1. A system comprising:
    a power management block for the system;
    a plurality of IO (input/output) blocks;
    a phase lock loop (PLL) block for each of the plurality of IO blocks, each of the PLL blocks being switchable between providing an output of a PLL clock signal or a replacement clock signal, wherein each of the plurality of IO blocks is coupled to a corresponding multiplexor, the corresponding multiplexor to provide the PLL clock signal when in an operational mode, and the corresponding multiplexor to provide the replacement clock signal when in a test mode; and
    a read only memory for storage of firmware;
    wherein the firmware includes elements to enable the test mode operation of the plurality of IO blocks utilizing replacement clocking.

2. The system of claim 1, wherein the replacement clock signal for each IO block is provided by a ring oscillator of the PLL block.

3. The system of claim 1, wherein the replacement clock signal for each IO block has a reduced frequency in comparison with a frequency of a respective PLL clock signal.

4. The system of claim 1, further comprising a central TAP (Test Access Port), the central TAP to provide a signal to each PLL block to switch between the PLL clock signal and the replacement clock signal.

5. The system of claim 4, further comprising a bypass component for each of the plurality of IO blocks, the bypass components being controllable by signals from the central TAP to select IO blocks for testing.

6. The system of claim 5, wherein the bypass component for each of the plurality of IO blocks is a bypass multiplexer, and wherein a first input of the bypass multiplexer of each IO block is coupled with an output of the respective IO block.

7. The system of claim 6, wherein a second input of the bypass multiplexer for each of the IO blocks is coupled with an output of a preceding bypass multiplexer or, for a first bypass multiplexer, with an output of the central TAP.

8. The system of claim 7, wherein an output of the bypass multiplexer for each of the IO blocks is coupled with the second input of a succeeding bypass multiplexer or, for a last bypass multiplexer, with an input of the central TAP.

9. The system of claim 1, further comprising a processing unit, the firmware to be executed by the processing unit.

10. The system of claim 1, wherein the system is a system on chip.

11. A non-transitory computer-readable storage medium having stored thereon data representing sequences of instructions that, when executed by a processor, cause the processor to perform operations comprising:
powering up components of a system;
initiating a board test of the system, the board test including testing of a plurality of IO (Input Output) blocks;
disabling phase lock loop (PLL) clocking for the plurality of IO blocks, wherein each of the plurality of IO blocks is coupled to a corresponding multiplexor, the corresponding multiplexor to provide a PLL clock signal when in an operational mode, and the corresponding multiplexor to provide a replacement clock signal when in a test mode;
providing instruction to bypass PLL elements for board testing;
switching clocking of IO blocks to replacement clocking; and
executing board testing process with IO blocks clocked by the replacement clocking.

12. The medium of claim 11, further comprising instructions that, when executed by the processor, cause the processor to perform operations comprising: upon completion of the board testing process, switching clocking for the plurality of IO blocks back to PLL clocking.

13. The medium of claim 11, wherein the replacement clocking for each IO block is provided by a respective ring oscillator.

14. The medium of claim 11, wherein a replacement clock signal has a reduced frequency in comparison with a frequency of a respective PLL clock signal.

15. The medium of claim 11, wherein the system includes a bypass component for each of the IO blocks, and further comprising instructions that, when executed by the processor, cause the processor to perform operations comprising:
setting one or more bypass components to select one or more IO blocks for testing.

16. The medium of claim 15, wherein the bypass components for the IO blocks are bypass multiplexers.

17. A computing system comprising:
one or more processors;
a power management block for the system;
a plurality of IO (input/output) blocks;
a phase lock loop (PLL) block for each of the plurality of IO blocks, each of the PLL blocks being switchable between providing an output of a PLL clock signal or a replacement clock signal, wherein each of the plurality of IO blocks is coupled to a corresponding multiplexor, the corresponding multiplexor to provide the PLL clock signal when in an operational mode, and the corresponding multiplexor to provide the replacement clock signal when in a test mode;
a read only memory for storage of firmware to be executed by the one or more processors; and
a transmitter or receiver for transmission or reception of data, and a dipole antenna for the transmission or reception of data;
wherein the firmware includes elements to enable the test mode operation of the plurality of IO blocks utilizing replacement clocking.

18. The computing system of claim 17, wherein the replacement clock signal for each IO block is provided by a ring oscillator of the PLL block.

19. The computing system of claim 17, wherein a replacement clock signal has a reduced frequency in comparison with a frequency of a respective PLL clock signal.

20. The computing system of claim 17, further comprising a central TAP (Test Access Port), the central TAP to provide a signal to each PLL block to switch between the PLL clock signal and the replacement clock signal.

21. The computing system of claim 20, further comprising a bypass component for each of the IO blocks, the bypass elements being controllable by signals from the central TAP to select IO block elements for testing.

22. The computing system of claim 21, wherein the bypass component for each of the plurality of IO blocks is a bypass multiplexer.

* * * * *